(12) United States Patent
Jara Rodelgo et al.

(10) Patent No.: US 11,246,222 B2
(45) Date of Patent: Feb. 8, 2022

(54) DRILLING TEMPLATE (71) Applicant: AIRBUS OPERATIONS S.L., Madrid (ES)

(72) Inventors: Alvaro Jara Rodelgo, Madrid (ES); Alvaro Torres Salas, Madrid (ES); Elena Moya Sanz, Madrid (ES); Paloma Llorente Garcia, Madrid (ES)

(73) Assignee: Airbus Operations S.L., Madrid (ES)

( * ) Notice: Subject to any disclaimer, the term of this patent is extended or adjusted under 35 U.S.C. 154(b) by 525 days.

(21) Appl. No.: 16/190,636

(22) Filed: Nov. 14, 2018

(65) Prior Publication Data
US 2019/0150290 A1 May 16, 2019

(30) Foreign Application Priority Data

Nov. 15, 2017 (EP) .................................. 17382774

(51) Int. Cl.
*H05K 3/00* (2006.01)
*H05K 1/02* (2006.01)
(Continued)

(52) U.S. Cl.
CPC ........... *H05K 3/0047* (2013.01); *B23B 47/28* (2013.01); *B23B 49/02* (2013.01); *B33Y 80/00* (2014.12);
(Continued)

(58) Field of Classification Search
CPC .. H05K 3/0047; H05K 1/0284; H05K 1/0373; H05K 1/18; H05K 2203/0195;
(Continued)

(56) References Cited

U.S. PATENT DOCUMENTS 5,181,809 A * 1/1993 Martin ............... G05B 19/4015
33/503
7,024,787 B2 * 4/2006 Varsell ..................... G01B 3/14
33/562
(Continued)

FOREIGN PATENT DOCUMENTS

DE  10 2017 200445  7/2017
WO  2016/142147  9/2016

OTHER PUBLICATIONS

Derwent Abstract: Li et al. "Three-Dimensional printed drilling template for making holes on adaptive aircraft curved skin, comprises fitting plate, where curvature of fitting plate is provided equal to curvature of aircraft curved skin, and guide rail is used" Jun. 26, 2020, entire Abstract. (Year: 2020).*
Extended Search Report for EP17382774.2, dated May 7, 2018, 8 pages.
De Leon et al, "Review High Performance Polymer Nanocomposites for Additive Manufacturing Applications," Reactive and Functional Polymers, 103, pp. 141-155 (2016).

*Primary Examiner* — Nimeshkumar D Patel
*Assistant Examiner* — Tania Courson
(74) *Attorney, Agent, or Firm* — Nixon & Vanderhye P.C.

(57) ABSTRACT

A 3D printed drilling template (20, 30*a*, 30*b*, 30*c*) including: a rigid framework able to be manipulated by an operator or an automaton, and a set of traversing (22, 32*a*, 32*b*, 32*c*, 33*c*) orifices in the framework and arranged to guide the drilling of holes into a structure on which the drilling template is mounted, wherein the drilling template (20, 30*a*, 30*b*, 30*c*) is designed or revised on an ad-hoc basis and manufactured by 3D printing and using a 3D printing material based on a polymer material mixed with powdered graphene.

20 Claims, 4 Drawing Sheets

(51) Int. Cl.
*H05K 1/03* (2006.01)
*G01B 5/00* (2006.01)
*H05K 1/18* (2006.01)
*B33Y 80/00* (2015.01)
*B23B 47/28* (2006.01)
*B23B 49/02* (2006.01)
*B29K 507/04* (2006.01)

(52) U.S. Cl.
CPC ......... *G01B 5/0014* (2013.01); *G01B 5/0025* (2013.01); *H05K 1/0284* (2013.01); *H05K 1/0373* (2013.01); *H05K 1/18* (2013.01); *B23B 2215/04* (2013.01); *B29K 2507/04* (2013.01); *B29K 2995/0005* (2013.01); *H05K 2201/10151* (2013.01); *H05K 2203/0195* (2013.01)

(58) Field of Classification Search
CPC .......... H05K 2201/10151; B33Y 80/00; B23B 47/28; B23B 49/02; B23B 2215/04; G01B 5/0025; G01B 5/0014; B29K 2507/04; B29K 2995/0005
See application file for complete search history.

(56) References Cited

U.S. PATENT DOCUMENTS

| | | | |
|---|---|---|---|
| 8,297,891 B2 * | 10/2012 | Collado Briceno | .... B23B 47/28 408/115 R |
| 8,621,761 B2 * | 1/2014 | Boyer | ...................... G01B 3/14 33/552 |
| 8,757,937 B1 | 6/2014 | Inman et al. | |
| 10,186,344 B2 * | 1/2019 | Prestayko | ............. B29C 70/882 |
| 10,390,578 B2 * | 8/2019 | Kuo | ...................... A42B 3/0433 |
| 10,462,907 B2 * | 10/2019 | Lewis | ............... H01L 23/49822 |
| 10,603,839 B2 * | 3/2020 | Lan | ......................... B33Y 50/00 |
| 10,717,167 B2 * | 7/2020 | Jesson | ..................... B23B 47/28 |
| 2014/0265035 A1 * | 9/2014 | Buser | ..................... B29C 64/393 264/401 |
| 2015/0201500 A1 * | 7/2015 | Shinar | ................... B29C 64/135 425/132 |
| 2016/0006123 A1 | 1/2016 | Li et al. | |
| 2017/0106452 A1 | 4/2017 | Andersson et al. | |
| 2018/0079132 A1 * | 3/2018 | Giesbers | ............... B29C 64/106 |
| 2019/0168445 A1 * | 6/2019 | Jara Rodelgo | ....... H05K 3/1275 |

* cited by examiner

DRILLING TEMPLATE

RELATED APPLICATION

This application claims priority to European Patent Application 17382774-2, filed Nov. 15, 2017, the entirety of which is incorporated by reference.

FIELD OF THE INVENTION

The present invention relates to a smart tool and a method to manufacture a smart tool. More specifically, the invention is relative to a smart tool drilling template and its different embodiments for use in the industrial sector, particularly in aeronautic and aerospace industries.

BACKGROUND

Drilling templates are conventionally used to establish exact positions and tolerances for drilling holes in a part or structure, such as in parts to be assembled to form a product. Drilling template are used in the manufacturing of aircraft and spacecraft to drill holes in composite or metallic parts which are to be aligned with holes in adjacent parts, such as to be used to for a fuselage. The holes are formed to receive fasteners, such as rivets, which are used to secure the parts together.

Aircraft and spacecraft are often large and several drilling templates are needed to map holes on a fuselage or other large part. A set of several drilling templates may be needed for each model of aircraft in a family of aircraft. A family of aircraft are aircraft which are given a common designation by a manufacture, such as the Airbus 330 family of aircraft. A different set of drilling templates are typically needed for each new version of aircraft in a family of aircraft, and sets of new drilling templates are needed for a new family of aircraft. Drilling templates that were originally designed for a specific aircraft type in a family are typically not reusable in the manufacture of other models of aircraft in the same family. Similarly, drilling templates originally designed for one family of aircraft are typically not reusable for another family of aircraft.

There is a long felt need to reuse drilling templates from one family of aircraft or spacecraft to another, or from one model aircraft to another in a family of aircraft or spacecraft. Reusable drilling templates

SUMMARY

In response to the long felt need for reusable drilling templates, the present invention was made to provide reusable drilling templates comprising:

a rigid framework able to be manipulate by an operator or an automaton, and a set of traversing orifices designed according to the requested holes to drill, wherein the drilling template is designed or revised on an ad-hoc basis and manufactured via a three dimensional (3D) printing technology based on a polymer material mixed with powdered graphene. The ad-hoc basis may be to modify the design of the drilling template(s) as new aircraft or spacecraft families are developed, or as new models of aircraft or spacecraft are developed in an existing family.

By 3D printing drilling templates with powdered graphene printed materials the resulting template has good mechanical properties, including resistance to tearing even at the high temperatures the template experience during drilling. Another advantage is the option to form the drilling templates by ALM (Additive Laser Manufacturing) which can quickly form simple or complex patterns of drilling templates. Another advantage provided by 3D printing is that it provides the ability to reshape or restyle partially or totally the drilling template, such as the framework and/or the set of traversing orifices of the templates.

The polymer material used for 3D printing drilling templates may be based on PLA (Polylactic Acid) or ABS (Acrylonitrile Butadiene Styrene). These printing materials are ecologically friendly because, in part, drilling templates formed by these materials may be recycled.

The drilling template may include a 3D printed circuit board partially or totally embedded within a rigid framework. The circuit board may include:

(i) a set of sensors able to measure values respectively from the rigid framework and/or from or with respect to the structure to drill;

(ii) a set of digital and/or analog components able to operate respectively digital or analog signals from the set of sensors;

(iii) at least one IHM (Interface Human Machine) able to allow to an operator or an automaton to interact with the sensors of the said drilling template; and (iv) at least one conductive trace able to connect the set of sensors to respectively the set of digital and/or analog components, and at least one IHM.

Adding a printing circuit board to a drilling template adds smart tool properties to the drilling template which enable the template to interact with a human operator or a automaton, such as a computer controller for a manufacturing process;

The set of sensors may include moisture sensors which detect and/or measure the humidity of the drilling template. Moisture sensors may be used to monitor and predict the need to manufacture a new drilling template in due time before the predicted failure of the previous drilling template. 3D printing of drilling templates enables the formation of drilling templates on demand, such as at a certain period before a predicted failure of the previous drilling template.

The set of sensors may include temperature sensors which measure the temperature at the surface of the structure which is being drilling and/or the temperature of the drilling template. Measurements of the temperature of the structure and/or template may be conveyed to the operator or automaton via the IHM. The temperature measurements may be used to determine if the friction is excessive between the drilling tool with the drilling template and/or the structure being drilled. These temperature measurements may be applied to slow or stop drilling when excessive temperatures are detected. The life of a drilling template may be extended by avoiding excessively heating the template, and reduce deformations in the template due to excessive temperatures. Deformations of drilling templates may cause inaccuracies in the location of holes drilled using the template.

In some embodiments, the set of sensors comprise gyroscopes and/or piezoelectric materials. One advantage of this embodiment is to allow to determine easily if the position and orientation of the drilling template is the adequate one. Another advantage of this solution is also to decrease the assembly time.

In some embodiments, at least one component of the set of digital and/or analog components are manufactured via 3D printed graphene.

In some embodiments, at least one component is a 3D printed Surface-Mount Component (SMT).

In some embodiments, the drilling template comprise a 3D printed antenna.

In some embodiments, the 3D printed antenna is a RFID (Radio Frequency Identification). One advantage with the RFID is the ability to transmit, receive and store remote data.

In some embodiments, the trace has a thermal conductivity or is able to conduct electricity;

In some embodiments, the IHM can be a buzzer, and/or a display interface such as LCD or a set of led.

The invention may be embodied as a drilling template comprising:

a rigid framework configured to be manipulated by an operator or an automaton, and a set of traversing orifices arranged in the rigid framework in a pattern conforming to holes to drill, wherein the drilling template is formed of 3D printed material, including a polymer material and powdered graphene.

The polymer material may include at least one of Polylactic Acid and Acrylonitrile Butadiene Styrene.

The drilling template may include a 3D printed circuit board partially or totally embedded within the rigid framework, wherein the 3D printed circuit board includes:

(i) a set of sensors configured to measure values of parameters associated with the rigid framework and/or a structure to which the drilling template is mounted;

(ii) a set of digital and/or analog components configured to receive and process digital or analog signals from the set of sensors;

(iii) at least one Interface Human Machine (IHM) configured to display information indicative of the measured values and interact with an operator or an automaton; and (iv) at least one conductive trace providing a conductive communication path between the set of sensors, the set of digital and/or analog components, and at least one IHM.

The set of sensors includes a moisture sensor configured to measure humidity at or near the drilling template. The set of sensors may include sensors configured to measure a temperature at a surface of a structure to which the drilling template is mounted and/or measure a temperature of the drilling template. The set of sensors may include a gyroscope and/or a piezoelectric based sensor which generate signals indicative of a position and/or orientation of the drilling template.

The at least one component of the set of digital and/or analog components include 3D printed materials that include graphene, and the at least one component is a 3D printed Surface-Mount Component.

The drilling template may also include a 3D printed antenna, such as a Radio Frequency Identification device.

The invention may be embodied as a method to form a drilling template comprising:

modifying an electronic file to modify a drilling template model or to modify three dimensional (3D) print instructions for the drilling template, wherein the modification conforms the drilling template model or the print instructions to a structure of an aircraft or a spacecraft;

3D printing a drilling template using the modified electronic file, wherein the 3D printing includes printing:

(i) printing a rigid framework having a surface configured to be mounted to a surface of the structure of the aircraft or spacecraft; and (ii) print orifices in the rigid framework and open to the surface, wherein the orifices are printed in a pattern conforming to holes to drill in the structure.

The method may further include:

3D printing a 3D printed circuit partially or totally embedded within the rigid framework, wherein the 3D printed circuit includes:

sensors configured to measure values of parameters associated with the rigid framework and/or the structure;

digital and/or analog electronic components configured to receive and process digital or analog signals from the sensors; and at least one conductive trace providing a conductive communication path between the sensors and the digital and/or analog electronic components.

The drilling template may include:

a rigid framework including a rigid plate having a plate surface conforming to a component surface of a component of an aircraft or spacecraft;

orifices in the rigid plate and open to the plate surface, wherein the orifices are arranged in a pattern of holes to be drilled in the component surface;

a 3D printed circuit board partially or totally embedded within the rigid framework, wherein the 3D printed circuit board includes:

sensors configured to measure values of parameters associated with the rigid framework and/or a structure to which the drilling template is mounted;

electronic components configured to receive and process digital or analog signals from the sensors, and transmit information indicative of the measured values; and a conductive trace providing a conductive communication path between the sensors and the electronic components, wherein the rigid framework and the 3D printed circuit board are a 3D printed single piece component formed of 3D printed material including a polymer material and powdered graphene.

The sensors includes a moisture sensor configured to measure humidity at or near the drilling template.

The polymer material may include at least one of Polylactic Acid and Acrylonitrile Butadiene Styrene.

The sensors may include a gyroscope or a piezoelectric based sensor which generate signals indicative of a position and/or orientation of the drilling template.

DESCRIPTION OF THE DRAWINGS

To complete the description and in order to provide for a better understanding of the invention, a set of drawings is provided. The drawings form an integral part of the description and illustrate embodiments of the invention. The drawings are.

DETAILED DESCRIPTION

The present invention is directed generally to the manufacture (3D printing) and structure of drilling templates. A person skilled in the relevant art of drilling templates will understand that the invention may have additional embodiments, and that the invention may be practiced without all of the details of the embodiments described below with reference to FIGS. 1 to 3c.

Figure 1:
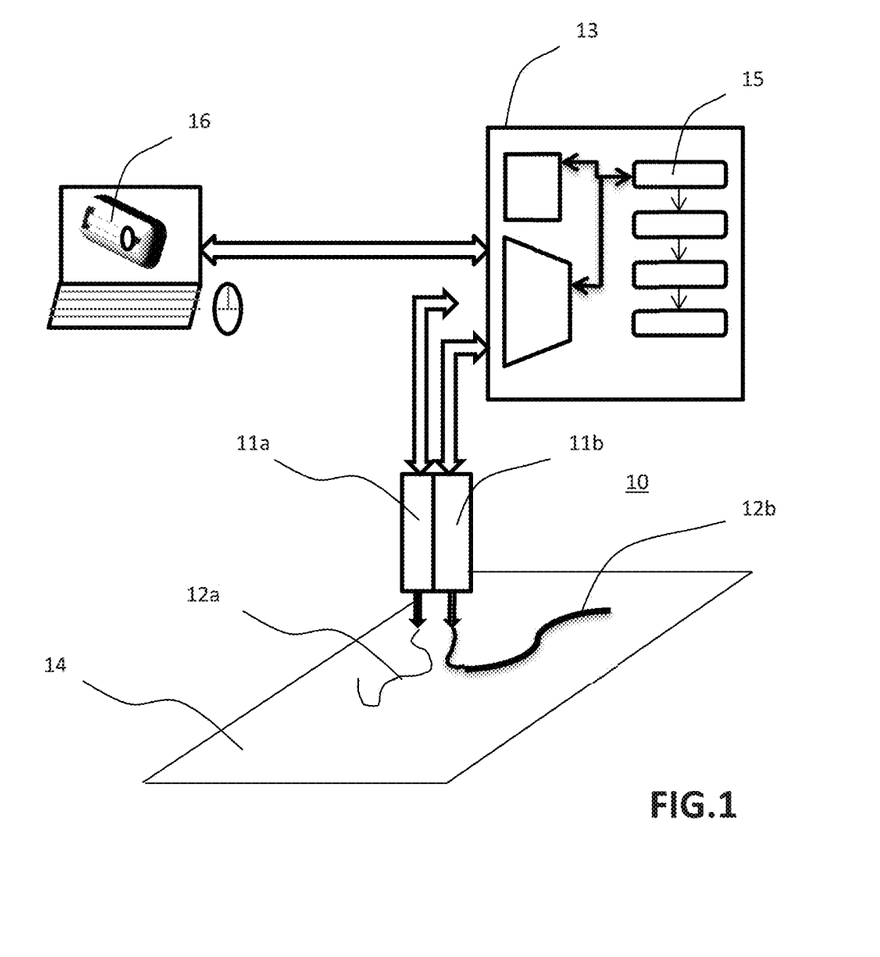
FIG. 1 is a schematic representation of main elements of 3D-printer.

3D (Three Dimensions) printing, also known as additive layer manufacturing, is increasingly important in different industrial sectors. There are many applications of 3D printing in the manufacturing of tools, jigs, and parts of simple or complex structure. Manufacturing via 3D printing technologies may be used with Fused Deposition Modelling (FDM) which is represented in FIG. 1.

Fused Deposition Modelling (FDM), also called FFF (Fused Filament Fabrication) or PJP (Plastic Jet Printing), is an additive manufacturing technology. Additive manufacturing technology is commonly used for thermoplastics 3D printing such as to form models, prototypes and product products. Additive manufacturing technology prints 3D parts by printing 2D (Two Dimensions) continuous thickness layers, which are usually called 2.5D (2.5 Dimensions) layers because there is no coordinated movement in 3D during the printing.

The 3D printing material used to 3D print include a polymer base which may be PLA (Polylactic Acid) or ABS (Acrylonitrile Butadiene Styrene).

The polymer base may be a powder. Graphene may be added to the polymer base to provide certain properties to the 3D printing material. Graphene is a nanomaterial that may be formed as a one-atom-thick planar sheet of bonded carbon atoms that are densely packed in a honeycomb crystal lattice. Graphene is a basic structural element of some variants of carbon such as graphite, charcoal, nanotubes, and fullerenes. Graphene has certain electronic and mechanical properties including:

(i) transparency and flexibility;

(ii) high thermal and electrical conductivity, such as a conductivity higher than Cu (copper) and Ag (silver);

(iii) high elasticity and hardness.

(iv) light weight, such as on the order of carbon fiber, and (v) enables electrons to flow faster than in silicon.

Adding graphene to a polymer base in a 3D printing material adds properties, such as flexibility and conductivity, which can be helpful in 3D printing applications for drilling templates. Furthermore, adding graphene to 3D printing materials allows for printing of conductive elements for 3D printed electronic components. 3D printing with graphene enhanced 3D print materials may be used to print active or passive electronic components, such as semi-conductors, dielectric-interfaces, transistors, integrated circuits, OLED displays, and organic photovoltaic cells.

Disclosed herein is a smart tool drilling template formed from 3D printed materials enhanced with graphene and printed using 3D printing technologies.

FIG. 1 shows a 3D-printer 10 configured to print a drilling template. The drilling template includes at least a first 3D-printing head 11*a* to selectively discharge conductive 3D-printing material 12*a* and a second 3D-printing head 11*b* to selectively discharge insulating 3D-printing material 12*b*.

The 3D printer 10 includes a processor 13 configured and programmed to control printing operations of the first and second 3D-printing heads 11*a*, 11*b*. The processor may be a computer controller which includes non-transitory memory or can access non-transitory memory in which is stored software applications and electronic files, such as 3D models of drilling templates, to control the 3D printing operations to form 3D printed components. The processor 13 of the 3D-printer 10 is configured to execute a list of steps 15, such as steps of a computer program, from a CAD (Computer-Aided Design) computer file 16 describing a multi-layer printed circuit board (PCB) intended for 3D-printing.

Each 3D printing head 11*a*, 11*b* is configured to print in X and Y directions to form a layer of conductive or insulating 3D-printing material. The 3D print heads 11*a*, 11*b* and/or a print bed 14 move under control of the processor 13 to print 3D material. The controlled movement is to position the 3D material as it is being printed to form the layers of the 3D product being printed.

The 3D print material may be a thermoplastic material filament 12*a*, 12*b* or wire that is heated beyond its glass transition temperature and then printed (discharged) as a liquid material by the 3D print heads 11*a, b* on a print bed/table 14. Quickly after being printed, the thermoplastic print material cools to solid form in the layer being printed an on the print table or on a previously printed layer of the material.

The first and second 3D-printing heads 11*a*, 11*b* are configured to 3D-print functional passive and/or active electrical components, functional resistors, functional capacitors, functional electromagnetic waveguides, functional optical waveguides, functional antennas including protruding antenna and horn antenna, functional heat sinks, functional coaxial elements such as coaxial cables and coaxial meshes, and a SMT/COB component or equivalent. A SMT component is a Surface Mounted Technology component. A COB component is a Chip-On-Board component assembly.

The first and second 3D-printing heads 11*a*, 11*b* are configured to 3D-print, in a 3D printing session, a PCB (Printed Circuit Board) and an electrical component embedded within the PCB.

The first 3D printing heads 11*a* is configured to discharge conductive 3D-printing material from at least a first and a second 3D-printing nozzles. The first 3D-printing nozzle is configured to discharge the conductive 3D-printing material through a first nozzle aperture having a first diameter. The second 3D-printing nozzle is configured to discharge the conductive 3D-printing material through a second nozzle aperture having a second diameter different that the diameter of the first nozzle. To switch between the at least first and second 3D printing nozzle, the 3D-printer 10 includes a switching module that selectively activates the first or second 3D printing nozzle during a 3D-print process. The switching module may be a software application executed by the processor 13.

The 3D printer 10 may include modules to perform various operations during a 3D print process. These modules may be software applications executed by the processor 13. The modules may also include physical tools or instruments to perform certain functions, such as curing 3D printed material, modifying 3D printed material or traces, and other functions. These modules are described below and can be use alone or in combination with other modules during a print session and to form a 3D printed component.

The following list of modules is not exhaustive and can be completed according the specific needs and the technological advances in the 3D-printer field.

An ultraviolet (UV) energy based curing module which emits ultraviolet radiation to cure curing 3D-printed materials region-by-region when the 3D-printed materials are being 3D-printed. The UV radiation may be applied to entire layer of a 3D printed component, as each layer is printed. Alternatively, the UV radiation may be focused on selected regions of the 3D printed material.

A laser module including a laser source which emits a laser beam to cure 3D-printed materials region-by-region when the 3D-printed materials are being 3D-printed. Alternatively, the laser beam may be directed towards the 3D printed material as the material is printed by the 3D print heads. The laser would emit a targeted laser beam for curing just-dispensed 3D-printed materials.

The 3D-printer 10 may be configured to proceed to a transition between two crossed conductive materials by 3D printing in sequence:

(i) Printing with the first 3D print head 11a a first trace of a conductive material 12a;

(ii) On the top of a selected location of the first trace, printing with the second 3D print head 11b a bridge formed from the 3D insulating material 12b, and (iii) On the top of the bridge, printing with the first 3D print head 11a, a second trace of conductive material 12a.

The 3D-printer 10 may also include an Automatic Optical Inspection (AOI) module with a camera and software applications configured to sequentially:

(i) capture an image of a 3D-printed conductive trace during an ongoing 3D-printing session;

(ii) compare the captured image to a reference indicating a required width of the 3D-printed conductive trace;

(iii) based on the comparison, determine that a width of at least a portion of the 3D-printed conductive trace is smaller than the required width; and (iv) trigger a corrective 3D-printing operation to increase the width of said portion of the 3D-printed conductive trace.

The Automatic Optical Inspection (AOI) module may be configured to sequentially:

(i) capture an image of 3D-printed conductive trace during an ongoing 3D-printed session;

(ii) compare the captured image to a reference indicating a required width of the 3D-printed conductive trace;

(iii) based on the comparison, determine that a width of at least a portion of the 3D-printed conductive trace is greater than the required width; and (iv) to trigger a laser ablation module to decrease the width of said portion of the 3D-printed conductive trace.

The Automatic Optical Inspection (AOI) module may be configured to sequentially:

(i) capture an image of 3D-printed conductive trace during an ongoing 3D-printing session;

(ii) compare the captured image to a reference indicating a required structure of the 3D-printed conductive trace;

(iii) based on a comparison, identify a fracture in the 3D-printed conductive trace; and (iv) trigger a corrective 3D-printing operation to 3D-print again, correctly, at least a region comprising said fracture.

The Automatic Optical Inspection (AOI) module may be configured to sequentially:

(i) capture an image of a 3D-printed pad of during an ongoing 3D-printing session of a 3D-printed PCB;

(ii) compare the captured image to a reference indicating a required structure of the 3D-printed pad;

(iii) based on the comparison, determine that the 3D-printed pad is excessively large; and (iv) trigger a laser ablation module to decrease the size of said 3D-printed pad.

The 3D-printer 10 may include a solder-mask 3D-printing module configured to 3D-print a solder-mask with conductive material 12a on a 3D-printed PCB, wherein the solder-mask and the PCB are 3D-printed in a single, unified, 3D-printing process.

The 3D-printer 10 may include a heat sink 3D-printing module to 3D-print a thermally-conductive heat sink integrated in a pre-defined region of a 3D-printed PCB being 3-printed.

The 3D-printer 10 is configured to print a thermally conductive heat transfer path as follows:

(i) determine that a particular region of a PCB being 3D-printed, being located under a 3D-printed conductive pad, requires a heat transfer path with increased thermal conductivity; and (ii) 3D-print, in a region under said 3D-printed conductive pad, with a first 3D-printing material having increased thermal conductivity relative to a second 3D-printing material used for 3D-printing at a surrounding region which does not require a heat transfer path with increased thermal conductivity.

The 3D-printer 10 may print a thermally conductive heat sink as follows:

(i) determine that a particular region of a PCB being 3D-printed requires a heat transfer path with increased thermal conductivity; and (ii) 3D-print, at the particular region of the PCB being 3D-printed, an electrically conductive path extending from said particular region downwardly to a 3D-printed heat sink at a bottom portion of the PCB being 3D-printed.

The 3D-printer 10 may include an embedded SMT component 3D-printing module to 3D-print a 3D-printed PCB having a fully-buried (unexposed) 3D-printed Surface-Mount Technology (SMT) component.

The 3D-printer 10 may include a pause- and resume 3D-printing function which:

(i) pauses a 3D-printing process of a PCB being 3D-printed, and (ii) waits until a COB/SMT component is assembled onto an already-3D-printed portion of the PCB on top of the COB/SMT that was 3D-printed.

The 3D-printer 10 may include a module, such as a software application, configured to modify a width or thickness of a 3D printed conductive trace, during a 3D-printing process of a conductive trace, by modifying at least one of:

(i) a width of the constructive trace being 3D-printed, and (ii) a thickness of the conductive trace being 3D-printed;

wherein the module is configured to modify the width and/or thickness of the conductive trace while maintaining a fixed current-carrying capacity of the conductive trace.

The 3D-printer 10 may include a module, such as a software application, configured to modify the rigidity and/or flexibility of a 3D printed PCB, by gradually-changing a level of rigidity of the 3D printed material being printed to form the PCB during a printing session.

The 3D-printer 10 may include a module, such as a software application, configured to modify the rigidity and/or flexibility of a 3D printed PCB by abruptly-changing a level of rigidity of 3D printed material being printed to form the PCB.

The 3D-printer 10 may include a module, such as a software module, configured to modify a thickness of a dielectric material being 3D printed between a first 3D-printed conductive layer and a second, neighboring, non-parallel, 3D-printed conductive layer.

The 3D printer 10 may be configured to 3D-print a conductive material to create a three-dimensional structure having a first layer of a PCB and a second, non-parallel, layer of the PCB.

The 3D-printer 10 may be configured to 3D-print a drilling template 20, 30a, 30b, 30c. The drilling templates each include a rigid framework 21, 31a, 31b, 31c. The drilling template design, such as 3D electronic model, may be revised by an operator or an automaton just prior to the 3D printing process to conform the template to the aircraft, spacecraft or other application intended for the drilling template.

An operator is a human or humanoid and may modify and arranges the 3D printing of a drilling template. An automaton is a self-operating machine or other control mechanism configured to automatically follow a predetermined sequence of operations, or respond to predetermined instructions.

The drilling template 20, 30a, 30b, 30c includes a set of traversing orifices 22, 32a, 32b, 32c, 33c arranged in the template according to the holes to drill through the template. The drilling template may be embodied in an electronic file, such as a 3D model or a stereolithography (STL), that is readable by the 3D printer 10.

The 3D-printer 10 is configured to allow the electronic file defining a drilling template to be modify on an ad-hoc basis.

The drilling template 20, 30a, 30b, 30c is 3D-printed via a 3D-printing technology based on a polymer material mixed with powdered graphene. The drilling template 20, 30a, 30b, 30c may be printed with 3D print materials that include graphene to have printed material properties such as good heat resistance and shape integrity when the printed drilling template is heated due to friction that occurs during drilling holes using the template as a drill guide.

Figure 3A:
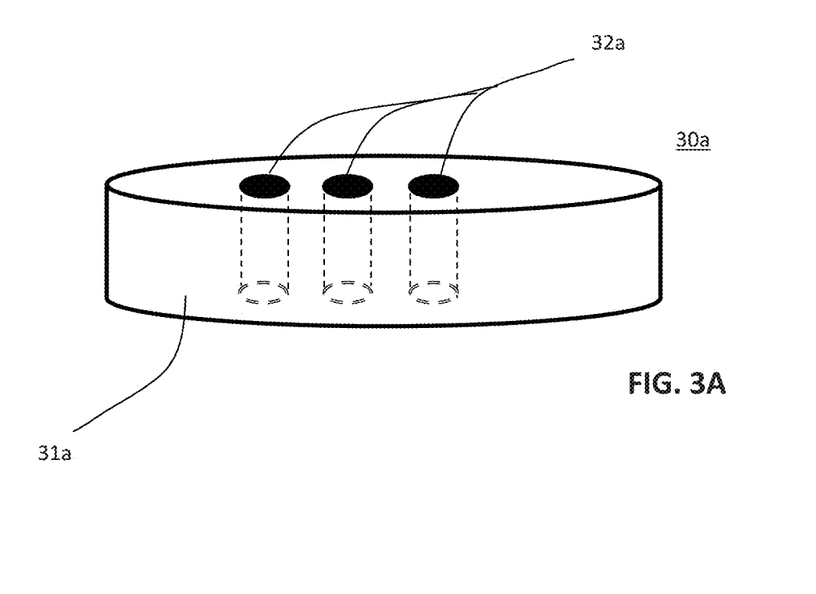
FIGS. 3a to 3c are a schematic representations of embodiments of a drilling template according to the invention.
Figure 3B:
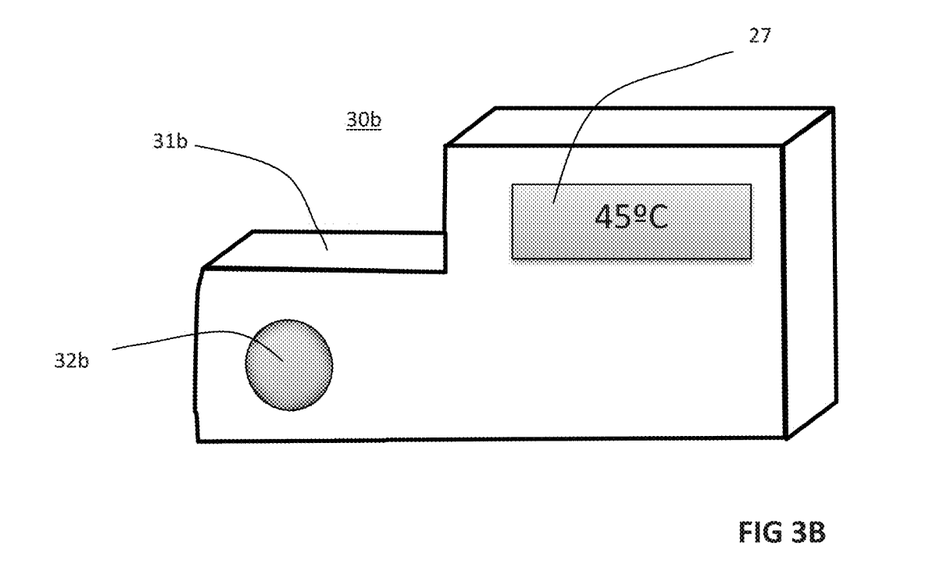
Figure 3C:
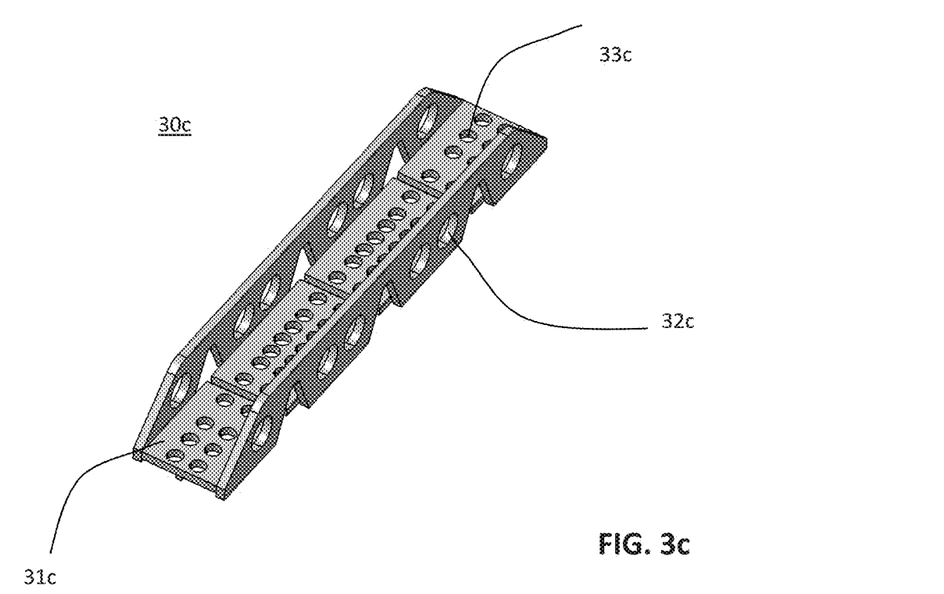

The drilling template may include one or more plates 31c each including orifices 33c. The plates 31c may have a surface configured to be mounted to or placed on a surface of an aircraft or spacecraft in which holes are to be drilled. The orifices 33c are arranged in a pattern in which the holes are to be drilled. The plates 31c may be supported by brackets 32c on opposite edges of the plates. The brackets 32c may be perpendicular to the plates and have lower edges that are intended to abut against the surface to be drilled. The brackets 32c may elevate the plates 31c above the surface to be drilled by a short distance, such as 1 mm to 1 cm. The elevation of the plates is to provide a gap between the plates 31c and the surface to be drilled into which drill cuttings may be received and to avoid scuffing of the surface to be drilled by the plates.

ALM (Additive Laser Manufacturing) may be used 3D-print a drilling template 20, 30a, 30b, 30c. The drilling template file, such as 3D model or STL file, may be revised to modify the shape of the drilling template, the location of the holes in the template and the properties of the template. These modifications may be made at the 3D printer or at a computer, separate from the printer, having software applications for reading and modifying the files for the drilling template.

The polymer material used in the 3D print material that forms the drilling template 20, 30a, 30b, 30c may include a base of PLA (Polylactic Acid) or ABS (Acrylonitrile Butadiene Styrene). An advantage of a PLA or ABS base is that the resulting drilling template may be recycled in an ecologically friendly way.

Figure 2:
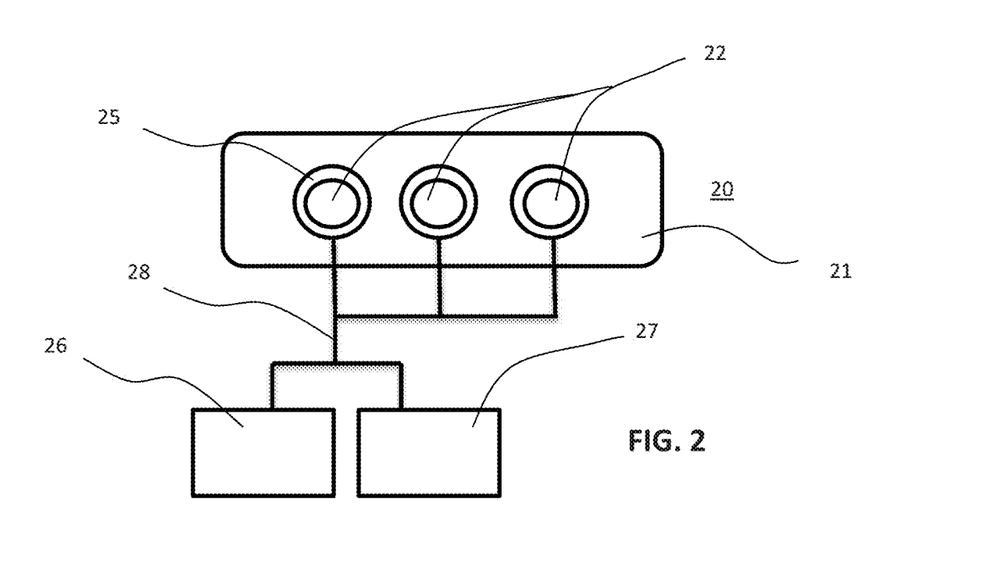
FIG. 2 is a schematic representation of the drilling template according to the invention.

The drilling template may include an electronic circuit board that is 3D-printed and partially or totally embedded within a rigid framework 21, 31a, 31b, 31c, such as a support frame, casing or housing. The electronic circuit board may include:

(i) a set of sensors 25, partially or totally 3D-printed, and configured to measure values, such as orientation (gyroscope), temperature, pressure, conductivity, humidly, and other environmental parameters, respectively from the rigid framework 21, 31a, 31b, 31c and/or from or with respect to the structure to drill;

(ii) a set of digital and/or analog components 26, partially or totally 3D-printed, and configured to operate respectively digital or analog signals from the set of sensors;

(iii) at least one IHM (Interface Human Machine) 27, partially or totally 3D-printed and configured to enable an operator or an automaton to interact with the sensors embedded on or in the drilling template 20, 30a, 30b, 30c; and (iv) at least one conductive trace 28 configured to connect the set of sensors to the set of digital and/or analog components and the at least one IHM.

An advantage of this embodiment is to confer smart properties to the drilling template 20, 30a, 30b, 30c to allow the drilling template to report or otherwise interact with the operator or automaton by itself or from a request. Because of the smart properties (electronic components) on the drilling template, the operator or the automaton is able to interact directly or indirectly with the drilling template 20, 30a, 30b, 30c via IHM or other communication devices.

The set of sensors 25 may include one or more moisture sensors to measure the humidity of the drilling template 20, 30a, 30b, 30c. Moisture sensors allow for the monitoring of the drilling template. Moisture information may be used to predict a remaining lifespan of a drilling template and when a new drilling template should be manufacture/3D-printed to avoid a potential unavailability of a useable drilling template during the manufacture of aircraft or spacecraft.

The set of sensors 25 may include sensors able to measure the temperature at the surface of the structure to drill and/or directly in the drilling template 20, 30a, 30b, 30c. Temperature sensors provide information regarding the operating temperature of a drilling template 20, 30a, 30b, 30c.

The temperature information is indicates a temperature of the surface of the structure to which the drilling template is mounted or the temperature of the drilling template or both. Because the temperature sensors are 3D printed during the formation of the drilling template 20, 30a, 30b, 30c, the drilling template is able to interact with the operator or automaton via the IHM 27, to provide information regarding the temperatures of the structure or template during the drilling of holes guided by the drilling template 20, 30a, 30b, 30c and into the surface of the structure on which the template is mounted. By having information regarding the temperature of the structure and/or drilling template, drilling operations may be performed to avoid excessively high temperatures and thereby increase the life of the drilling templates 20, 30a, 30b, 30c. Also, avoiding excessively high temperatures, reduces the tendency of drilling templates to deform due to overheating and thus increases the accuracy of the drilling of holes into the structure using the drilling template.

The set of sensors 25 may include gyroscopes and/or piezoelectric materials, which provide information regarding the position and orientation of the drilling template 20, 30a, 30b, 30c. Position and orientation information may be used to determine if the drilling template is properly positioned on a structure to be drilled and properly oriented on the structure.

The at least one component of the set of digital and/or analog components 26, e.g., electronic components, are 3D printed using 3D-printed graphene materials and may include 3D printed conductive and dielectric (non-conductive) traces and structures. The digital and/or The least one component 26 may include or be a 3D printed Surface-Mount Component (SMT) or a Chip On Board (COB).

The drilling template may comprise a 3D printed antenna. The 3D printed antenna may be a RFID (Radio Frequency Identification) antenna. An antenna, such as a RFID antenna, is able to transmit and receive and store (in the case of a RFID antenna) data to allow for communications between a humanoid or an automaton and a drilling template 20, 30a, 30b, 30c.

The 3D printed trace 28 may have a thermal conductivity and/or an electrical conductivity. The 3D-printer 10 may be configured to adjust the amount of graphene powder in the conductive material 12a to adjust the conductivity of the trace 28 being 3D printed.

The IHM may be a buzzer and/or a display interface, such as liquid crystal display (LCD) panel or light emitting diodes (LEDs) which display information obtained from the drilling template to the human operator. For a humanoid or automaton, the communication device may be used to transmit data captured by the sensors on the drilling template 20, 30a, 30b, 30c and otherwise interact with the drilling template.

The drilling template 20, 30a, 30b, 30c may include a battery which provides electrical power to the sensors 25, the digital and/or analog components 26, and the IHM 27. The battery may be rechargeable.

From the foregoing, it will be appreciated that specific embodiments of the invention have been described herein for purposes of illustration, but that various modifications may be made without deviating from the spirit and scope of the invention. For example, aspects of the invention described in the context of particular embodiments may be combined or eliminated in other embodiments. Although advantages associated with certain embodiments of the invention have been described in the context of those embodiments, other embodiments may also exhibit such advantages. Additionally, none of the foregoing embodiments need necessarily exhibit such advantages to fall within the scope of the invention. Accordingly, the invention is not limited except as by the appended claims.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention is:

1. A drilling template comprising:
a rigid framework configured to be manipulated by an operator or an automaton;
a set of traversing orifices arranged in the rigid framework in a pattern conforming to holes to drill into a structure to which the rigid framework is mounted, wherein the drilling template is formed of 3D printed material, including a polymer material and powdered graphene;
a 3D printed circuit board partially or totally embedded within the rigid framework, wherein the 3D printed circuit board includes:
a set of sensors configured to measure values of conditions associated with the rigid framework and/or the structure to which the drilling template is mounted,
a set of digital and/or analog electronic components configured to receive and process digital or analog signals from the set of sensors;
an interface configured to communicate with at least one Interface Human Machine (IHM) configured to display information indicative of the measured values and interact with an operator or an automaton; and
at least one conductive trace providing a conductive communication path between the set of sensors, the set of digital and/or analog components, and the interface for the at least one IHM,
wherein the rigid framework and the 3D printed circuit board are a 3D printed single piece component formed of 3D printed material including a polymer material and powdered graphene.

2. The drilling template according to claim 1, wherein the polymer material includes at least one of Polylactic Acid and Acrylonitrile Butadiene Styrene.

3. The drilling template according to claim 1, wherein the set of sensors includes a moisture sensor configured to measure humidity at or near the drilling template.

4. The drilling template according to claim 1, wherein the set of sensors includes sensors configured to measure a temperature at a surface of the structure to which the drilling template is mounted and/or measure a temperature of the drilling template.

5. The drilling template according to claim 1, wherein the set of sensors includes a gyroscope and/or a piezoelectric based sensor which generate signals indicative of a position and/or orientation of the drilling template.

6. The drilling template according to claim 1, wherein the at least one conductive trace is a 3D printed conductive trace.

7. The drilling template according to claim 1, wherein the IHM is at least one of a buzzer and a display device.

8. The drilling template according to claim 1, wherein at least one sensor of the set of sensors is adjacent at least one orifice of the set of traversing orifices.

9. The drilling template according to claim 1, wherein the at least one component of the set of digital and/or analog components include 3D printed materials that include graphene.

10. The drilling template according to claim 9, wherein the at least one component is a 3D printed Surface-Mount Component.

11. The drilling template according to claim 1, wherein the drilling template includes a 3D printed antenna.

12. The drilling template according to claim 11, wherein the drilling 3D printed antenna is a Radio Frequency Identification device.

13. A method to form a drilling template comprising:
modifying an electronic file to modify a drilling template model or a three dimensional (3D) print instructions for the drilling template, wherein the modification conforms the drilling template model or the print instructions to a structure of an aircraft or a spacecraft and to a desired hole pattern to be drilled into the structure;
3D printing a drilling template using the modified electronic file, wherein the 3D printing includes printing:
(i) printing a rigid framework having a surface configured to be mounted to a surface of the structure of the aircraft or spacecraft;
(ii) printing orifices in the rigid framework and open to the surface, wherein the orifices are printed in a pattern conforming to holes to drill in the structure; and (iii) printing a printed circuit at least partially embedded in the rigid framework, wherein the 3D printed circuit includes:
  sensors configured to measure values of parameters associated with the rigid framework and/or the structure, wherein at least one of the sensors is proximate at least one of the orifices;
  digital and/or analog electronic components configured to receive and process digital or analog signals from the sensors;
  an interface configured to communicate with at least one Interface Human Machine (IHM) which is configured to display information representing the measured values, and interact with an operator or an automaton, and
  at least one conductive trace providing a conductive communication path between the sensors and the digital and/or analog electronic components,
  wherein the rigid framework and the 3D printed circuit board are a 3D printed single piece component formed of 3D printed material including a polymer material and powdered graphene.

14. The method of claim 13 further comprising 3D printing an Interface Human Machine that is at least partially embedded in the rigid framework and 3D printing the at least one conductive trace to provide the conductive path between the digital and/or analog electronic components and the Interface Human Machine.

15. A drilling template comprising:
  a rigid framework including a rigid plate having a plate surface conforming to a component surface of a component of an aircraft or spacecraft;
  orifices in the rigid plate and open to the plate surface, wherein the orifices are arranged in a pattern of holes to be drilled in the component surface;
  a 3D printed circuit board at least partially embedded in the rigid framework, wherein the 3D printed circuit board includes:
  sensors configured to measure values of parameters associated with the rigid framework and/or a structure to which the drilling template is mounted, wherein at least one of the sensors is next to at least one of the orifices;
  electronic components configured to receive and process digital or analog signals from the sensors, and transmit information indicative of the measured values; and
  a conductive trace providing a conductive communication path between the sensors and the electronic components,
  wherein the rigid framework and the 3D printed circuit board are a 3D printed single piece component formed of 3D printed material including a polymer material and powdered graphene.

16. The drilling template of claim 15, further comprising a 3D printed Interface Human Machine that is at least partially embedded in the rigid framework and the conductive trace to provide the conductive path between the digital and/or analog electronic components and the Interface Human Machine.

17. The drilling template according to claim 15, wherein the sensors includes a moisture sensor configured to measure humidity at or near the drilling template.

18. The drilling template according to claim 15, wherein the polymer material includes at least one of Polylactic Acid and Acrylonitrile Butadiene Styrene.

19. The drilling template according to claim 15, wherein the sensors includes a gyroscope or a piezoelectric based sensor which generate signals indicative of a position and/or orientation of the drilling template.

20. The drilling template according to claim 15, wherein at least one sensor of the set of sensors is adjacent at least one orifice of the set of traversing orifices.

* * * * *